United States Patent
Lee et al.

(10) Patent No.: US 7,667,398 B2
(45) Date of Patent: Feb. 23, 2010

(54) SEALANT WITH COLORED SPACES AND FLAT PANEL DISPLAY DEVICE EMPLOYING THE SAME

(75) Inventors: Ho Seok Lee, Suwon-si (KR); Jong-Woo Lee, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 336 days.

(21) Appl. No.: 11/634,198

(22) Filed: Dec. 6, 2006

(65) Prior Publication Data

US 2007/0132382 A1  Jun. 14, 2007

(30) Foreign Application Priority Data

Dec. 8, 2005  (KR)  .................. 10-2005-0119306

(51) Int. Cl.
*H01J 1/62*  (2006.01)

(52) U.S. Cl. ...................................... 313/512; 313/582
(58) Field of Classification Search ................ 313/506, 313/504, 503, 512, 582–587; 359/627
See application file for complete search history.

(56) References Cited

U.S. PATENT DOCUMENTS

| | | | |
|---|---|---|---|
| 6,888,308 B1 * | 5/2005 | Guenther | 313/512 |
| 2003/0156331 A1 * | 8/2003 | Oie et al. | 359/627 |
| 2007/0290612 A1 * | 12/2007 | Hama et al. | 313/506 |

FOREIGN PATENT DOCUMENTS

KR  U1998-068070  12/1998

* cited by examiner

*Primary Examiner*—Joseph L Williams
(74) *Attorney, Agent, or Firm*—Lee & Morse, P.C.

(57) ABSTRACT

A flat panel display device, including a substrate, a display unit disposed on the substrate, a sealing substrate affixed to the substrate to enclose the display unit therebetween, and a sealant composition disposed between the substrate and the sealing substrate, wherein the sealant composition includes an adhesive component and colored spacers.

12 Claims, 1 Drawing Sheet

SEALANT WITH COLORED SPACES AND FLAT PANEL DISPLAY DEVICE EMPLOYING THE SAME

BACKGROUND OF THE INVENTION

1. Field of the Invention

The present invention relates to a flat panel display device. In particular, the present invention relates to a flat panel display device having a sealant composition providing an improved means for measuring a width thereof.

2. Description of the Related Art

In general, a flat panel display device may refer to a thin, light display device, such as an organic light emitting display apparatus. The conventional flat panel display device may include a display unit with a plurality of light emitting diodes positioned on a substrate.

Additionally, the conventional flat panel display device may include a sealing substrate to protect the light emitting diodes from degradation caused by an oxidation, i.e., an interaction with oxygen from indium-tin-oxide (ITO) used in electrodes, a reaction between interfaces of light emitting layers, or by external impurities, e.g., moisture, oxygen, ultraviolet rays, manufacturing conditions, and so forth. The sealing substrate may be attached to the substrate by a sealant to enclose the display unit therebetween. The conventional sealant may include spacers to minimize compression of the display unit and maintain a predetermined distance between the substrate and the sealing substrate.

Application of a sealant to the flat panel display device may involve consideration of a width thereof. More specifically, the sealant should be sufficiently wide to prevent penetration of external impurities therethrough. On the other hand, an excessive width of the sealant may trigger sealant penetration into the display unit and cause a malfunction thereof. Accordingly, the width of the sealant may be evaluated to provide proper operation of the flat panel display device.

However, the width of the conventional sealant employed in the conventional flat panel display device is often evaluated by the naked eye upon attaching the substrate with the sealing substrate. More importantly, the conventional sealant may be transparent, thereby triggering measuring errors regarding the width thereof. Consequently, the width of the conventional sealant in the conventional flat panel display device may not be correctly measured and applied, thereby generating potential malfunctioning of the display unit.

Accordingly, there exists a need to provide a flat panel display device having a structure capable of facilitating measurement of the sealant width employed therein.

SUMMARY OF THE INVENTION

The present invention is therefore directed to a sealant and a flat panel display device employing the same, which substantially overcome one or more of the disadvantages of the related art.

It is therefore a feature of an embodiment of the present invention to provide a sealant composition providing an improved visual means for evaluating a width thereof.

It is therefore another feature of an embodiment of the present invention to provide a flat panel display device having a sealant composition providing an improved means for measuring a width thereof.

At least one of the above and other features and advantages of the present invention may be realized by providing a sealant composition, including an adhesive component and a plurality of colored spacers disposed within the adhesive component. The adhesive component may include an epoxy material. The plurality of colored spacers may include any one of colored silica or a polymer having a functional radical capable of exhibiting color.

In another aspect of the present invention, there is provided a flat panel display device, including a substrate, a display unit disposed on the substrate, a sealing substrate affixed to the substrate to enclose the display unit therebetween, and a sealant composition disposed between the substrate and the sealing substrate, wherein the sealant composition may include colored spacers.

The sealant composition may be disposed around the display unit. Additionally, the sealant composition may include an epoxy material. The colored spacers may include colored silica or a polymer having a functional radical capable of exhibiting color.

The flat panel display device may be an organic light-emitting display apparatus. Additionally, either the substrate or the sealing substrate of the flat panel display device may be transparent.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
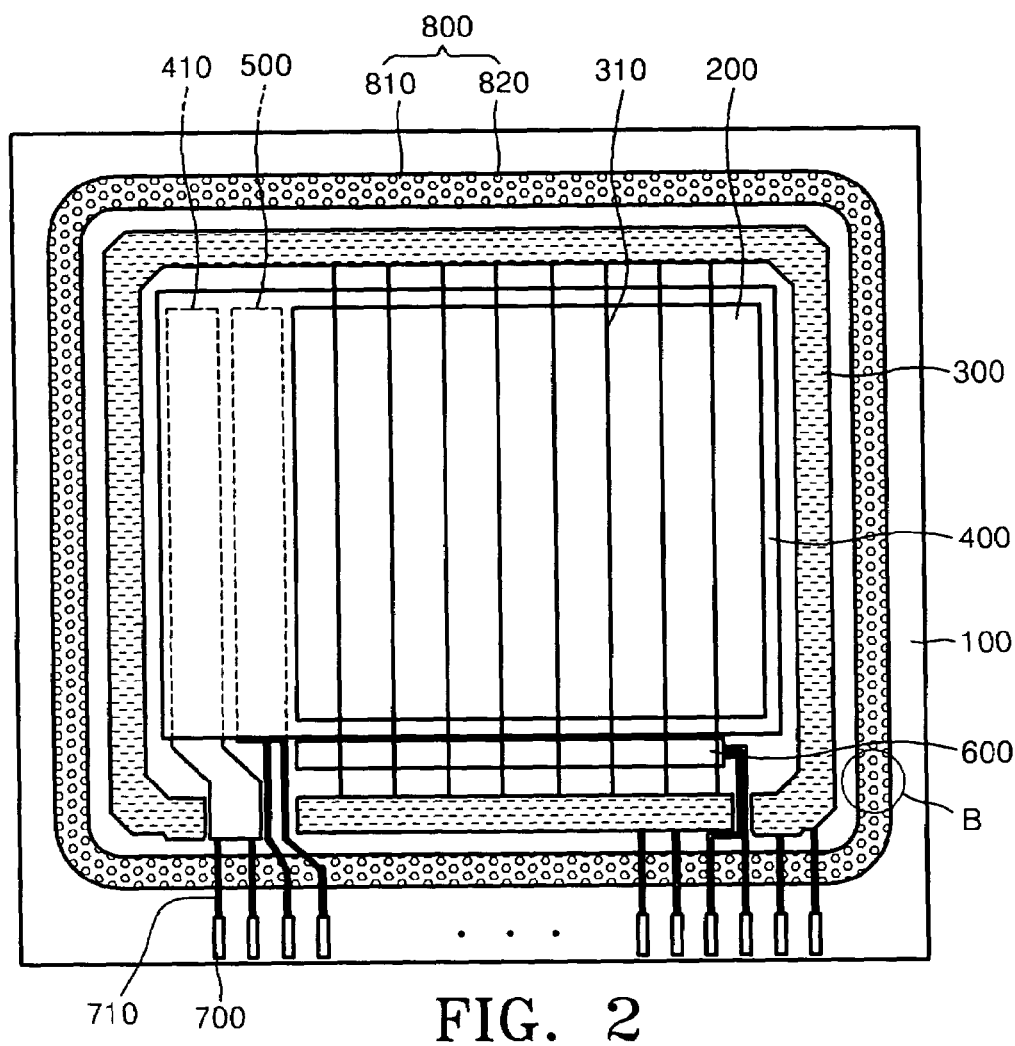
FIG. 1 illustrates a plan view of a flat panel display device according to an embodiment of the present invention.

This application claims the benefit of Korean Patent Application No. 10-2005-0119306, filed on Dec. 8, 2005, in the Korean Intellectual Property Office, and entitled: "Sealant and Organic Light Emitting Display Apparatus," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when an element is referred to as being "on" another element or substrate, it can be directly on the other element or substrate, or intervening elements may also be present. Further, it will be understood that when an element is referred to as being "under" another element, it can be directly under, or one or more intervening elements may also be present. In addition, it will also be understood that when an element is referred to as being "between" two elements, it can be the only element between the two elements, or one or more intervening elements may also be present. Like reference numerals refer to like elements throughout.

An exemplary embodiment of a flat panel display device according to the present invention is more fully described below with reference to FIG. 1.

As illustrated in FIG. 1, a flat panel display device according to an embodiment of the present invention may include a display unit 200, a substrate 100 made of glass, metal, or plastic, and a sealing substrate (not shown). Additionally, the flat panel display device according to an embodiment of the present invention may include a sealant 800 to attach the sealing substrate to the substrate 100 with the display unit 200 therebetween.

The flat panel display device according to an embodiment of the present invention may also include a vertical circuit unit 500, a horizontal circuit unit 600, and a driving power wire unit 300. The vertical and horizontal circuit units 500 and 600 may be positioned outside the display unit 200 and electrically connected to a terminal 700 via a wire 710 in order to transmit signals to a plurality of thin film transistors in the display unit 200. The driving power wire unit 300 may be positioned outside the display unit 200 and electrically connect to the terminal 700 via a plurality of driving lines 310 included in the display unit 200 in order to supply driving power thereto.

The display unit 200 of the flat panel display device according to an embodiment of the present invention may be an electroluminescent display unit, e.g., an organic light emitting display unit, having a plurality of light emitting diodes, e.g., organic light emitting diodes, positioned on the substrate 100 to form a plurality of pixels. Each light emitting diode may include a pixel electrode (not shown), a facing electrode 400, and an intermediate layer therebetween (not shown) having at least one light-emitting layer.

The pixel electrode of the display unit 200 may be a transparent electrode or a reflective electrode. If the pixel electrode is a transparent electrode, it may be formed of any one of indium tin oxide (ITO), indium zinc oxide (IZO), zinc oxide (ZnO), or indium oxide ($In_2O_3$). If the pixel electrode is a reflective electrode, it may be formed of any one of indium tin oxide (ITO), indium zinc oxide (IZO), zinc oxide (ZnO), or indium oxide ($In_2O_3$) deposited on a reflection film made of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), any other like metal, or a combination thereof.

The facing electrode 400 of the display unit 200 may also be either a transparent electrode or a reflective electrode. Accordingly, if the facing electrode 400 is a transparent electrode, it may be formed of an auxiliary electrode layer or a bus electrode line deposited onto a metal material having a low work function. For example, the auxiliary electrode layer or the bus electrode line may be formed of any one of indium tin oxide (ITO), indium zinc oxide (IZO), zinc oxide (ZnO), or indium oxide ($In_2O_3$), and the metal material having a low work function may be any one of lithium (Li), calcium (Ca), lithium-fluoride-calcium (LiF/Ca), lithium-fluoride-aluminum (LiF/Al), silver (Ag), magnesium (Mg), aluminum (Al), a like metal, or a combination thereof. If the facing electrode 400 is a reflective electrode, it may be formed of a layer of lithium (Li), calcium (Ca), lithium-fluoride-calcium (LiF/Ca), lithium-fluoride-aluminum (LiF/Al), silver (Ag), magnesium (Mg), aluminum (Al), or a like metal material. However, it should be noted that other materials for forming the pixel electrode and facing electrode 400 are not excluded from the scope of the present invention. For example, the pixel electrode and the facing electrode 400 may be formed of an organic material, e.g., a conductive polymer.

The facing electrode 400 of the light emitting diode according to an embodiment of the present invention may be connected to the terminal 700 through an electrode wire unit 410 and the wire 710 positioned outside the display unit 200.

The intermediate layer of the display unit 200 may include at least one phosphorescent layer made of any known type of organic or inorganic light-emitting material known in the art, e.g., low-molecular weight organic material, polymeric organic material, and so forth, to emit light through a combination of holes and electrons supplied from the pixel electrode and facing electrode 400. If the intermediate layer is made of a low-molecular weight organic material, it may be formed of any one of copper phthalocyanine (CuPc), N,N'-di(naphthalene-1-yl)-N,N'-diphenyl-benzidine (NPB), tris-8-hydroxyquinoline aluminum (Alq3), or a like material by any method known in the art, such as an evaporation method. The intermediate layer may be formed to have a single or a composite structure having at least one of a hole injection layer (HIL), a hole transport layer (HTL), an emission layer (EML), an electron transport layer (ETL), and an electron injection layer (EIL). If the intermediate layer is formed of a polymeric organic material, it may be formed to have a structure including an HTL and an EML by way of screen printing or ink jet printing. The HTL may be formed of poly-(2,4)-ethylene-dihydroxythiophene (PEDOT), and the EML may be formed of Poly-Phenylenevinylene (PPV) or Polyfluorene polymer organic material. However, it should be noted that other structures of the intermediate layer are not excluded from the scope of the present invention.

The sealant 800 of the flat panel display device according to an embodiment of the present invention may be formed around the display unit 200, as illustrated in FIG. 1. More specifically, the sealant 800 may be applied to peripheral areas, i.e., along a perimeter, of the substrate 100, such that the sealing substrate may be applied thereto to form an enclosed space therebetween for the display unit 200. Without intending to be bound by theory, it is believed that the geometric shape, i.e., a configuration surrounding the display unit 200, of the sealant 800 may minimize penetration of external impurities therethrough into the display unit 200. Additionally, it is believed that the sealant 800 may prevent compression of the display unit 200 by the sealing substrate upon attachment of the sealing substrate to the substrate 100 and maintain a predetermined distance therebetween.

Figure 2:
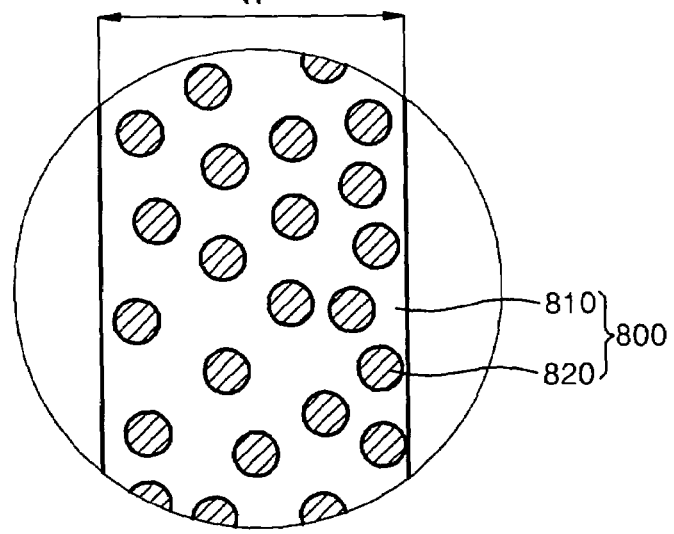
FIG. 2 illustrates an enlarged view of region "B" illustrated in FIG. 1.

The sealant 800 may include an adhesive component 810 and a plurality of spacers 820, as illustrated in FIGS. 1-2. The adhesive component 810 may be any adhesive, e.g., epoxy material, known in the art that may be employed to attach the substrate 100 and the sealing substrate. The plurality of spacers 820 may be of any convenient colored material and shape, e.g., circular, as determined by one of ordinary skill in the art. In particular, the plurality of spacers 820 may be made of any colored material exhibiting sufficient hardness to maintain a predetermined distance between the substrate 100 and the sealing substrate upon attachment thereof.

For example, the spacers 820 may be formed of a transparent silica material and, subsequently, colored with acidic dyes by way of dying or adsorption. Alternatively, the spacers 820 may be formed of a polymer material, wherein the color of the spacers 820 may be obtained and adjusted by modifying a functional radical of the polymer material while maintaining the intrinsic characteristics thereof.

Without intending to be bond by theory, it is believed that employing the colored spacers 820 in the sealant 800 in accordance with the present invention, may facilitate the measurement of a width W of the sealant 800 upon application thereof between the substrate 100 and the sealing substrate. In particular, the colored spacers may provide an advantageous method for determining by the naked eye, i.e., visual detection without optical aides, the width of the sealant 800, as illustrated in FIG. 2, and adjusting it accordingly. In this respect, it should be noted that observation of the sealant 800 may be facilitated if either the substrate 100 or the sealing substrate is transparent. Further, a "width" of the sealant 800 refers to a distance as measured from one edge of the sealant

800 to a parallel edge of the sealant 800 along a direction parallel to a plane of the substrate 100, as illustrated in FIG. 2.

The flat panel display apparatus according to an embodiment of the present invention may be any flat panel display apparatus known in the art, such as an organic light emitting display apparatus, liquid crystal display apparatus, and so forth.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display device, comprising:
   a substrate;
   a display unit disposed on the substrate;
   a sealing substrate affixed to the substrate to enclose the display unit therebetween; and
   a sealant composition disposed between the substrate and the sealing substrate, wherein the sealant composition includes colored spacers, the colored spacers being entirely and uniformly colored throughout.

2. The flat panel display device as claimed in claim 1, wherein the sealant composition is disposed around the display unit.

3. The flat panel display device as claimed in claim 1, wherein the sealant composition includes an epoxy material.

4. The flat panel display device as claimed in claim 1, wherein the plurality of colored spacers are colored silica.

5. The flat panel display device as claimed in claim 1, wherein either the substrate or the sealing substrate is transparent.

6. The flat panel display device as claimed in claim 1, wherein the flat panel display device is an organic light emitting display apparatus.

7. The sealant composition as claimed in claim 1, wherein the plurality of colored spacers consists essentially of a colored material.

8. The flat panel display device as claimed in claim 1, wherein the plurality of colored spacers includes a polymer having a functional radical capable of exhibiting color.

9. The flat panel display device as claimed in claim 1, wherein a concentration of the colored spacers in the sealant relative to the adhesive component is substantially high, the concentration of the colored spacers being sufficiently high to measure a width of the sealant.

10. The flat panel display device as claimed in claim 1, wherein at least a portion of the plurality of colored spacers is aligned along at least a first edge of the sealant, the first edge of the sealant and the aligned colored spacers being substantially coextensive.

11. The flat panel display device as claimed in claim 10, wherein a portion of the plurality of colored spacers is aligned along a second edge of the sealant to be coextensive therewith, the second edge of the sealant being opposite the first edge of the sealant.

12. The flat panel display device as claimed in claim 10, wherein a width of the sealant substantially equals a distance between the colored spacers aligned along the first edge thereof and the second edge thereof.

\* \* \* \* \*